(12) United States Patent
Wirbeleit et al.

(10) Patent No.: US 7,727,827 B2
(45) Date of Patent: Jun. 1, 2010

(54) METHOD OF FORMING A SEMICONDUCTOR STRUCTURE

(75) Inventors: Frank Wirbeleit, Dresden (DE); Rolf Stephan, Dresden (DE); Manfred Horstmann, Duerrroehrsdorf-Dittersbach (DE)

(73) Assignee: GlobalFoundries Inc., Grand Cayman (KY)

( * ) Notice: Subject to any disclaimer, the term of this patent is extended or adjusted under 35 U.S.C. 154(b) by 51 days.

(21) Appl. No.: 11/942,400

(22) Filed: Nov. 19, 2007

(65) Prior Publication Data

US 2008/0242040 A1    Oct. 2, 2008

(30) Foreign Application Priority Data

Mar. 30, 2007    (DE)    .................. 10 2007 015 505

(51) Int. Cl.
*H01L 21/338*    (2006.01)

(52) U.S. Cl. ...................... 438/181; 438/305

(58) Field of Classification Search ......... 438/181–183, 438/230, 301–303, 305, 306, 574, 579
See application file for complete search history.

(56) References Cited

U.S. PATENT DOCUMENTS

| | | | | |
|---|---|---|---|---|
| 5,672,890 A | | 9/1997 | Nakajima .................... | 257/192 |
| 5,869,379 A | * | 2/1999 | Gardner et al. .............. | 438/305 |
| 6,103,559 A | | 8/2000 | Gardner et al. .............. | 438/183 |
| 6,235,564 B1 | | 5/2001 | Itoh et al. .................... | 438/183 |
| 6,323,112 B1 | * | 11/2001 | Lou ............................ | 438/514 |
| 6,528,376 B1 | | 3/2003 | Guo ............................ | 438/302 |
| 6,979,635 B1 | | 12/2005 | Sultan et al. ................ | 438/595 |
| 2002/0137299 A1 | | 9/2002 | Tseng et al. ................ | 438/373 |
| 2006/0276017 A1 | | 12/2006 | Kim ........................... | 438/583 |

FOREIGN PATENT DOCUMENTS

| DE | 10250888 B4 | 1/2007 |
|---|---|---|
| JP | 11238879 | 8/1999 |
| WO | WO 2005/057663 | 6/2005 |

OTHER PUBLICATIONS

Translation of Official Communication from German Patent Office for German Patent Application No. 10 2007 015 505.2-33 dated Mar. 18, 2008.
PCT Search Report and Written Opinion from PCT/US2008/004066 dated Jun. 18, 2008.

* cited by examiner

*Primary Examiner*—David Vu
(74) *Attorney, Agent, or Firm*—Williams, Morgan & Amerson, P.C.

(57) ABSTRACT

A method of forming a semiconductor structure comprises providing a semiconductor substrate. A feature is formed over the substrate. The feature is substantially homogeneous in a lateral direction. A first ion implantation process adapted to introduce first dopant ions into at least one portion of the substrate adjacent the feature is performed. The length of the feature in the lateral direction is reduced. After the reduction of the length of the feature, a second ion implantation process adapted to introduce second dopant ions into at least one portion of the substrate adjacent the feature is performed. The feature may be a gate electrode of a field effect transistor to be formed over the semiconductor substrate.

15 Claims, 6 Drawing Sheets

METHOD OF FORMING A SEMICONDUCTOR STRUCTURE

BACKGROUND OF THE INVENTION

1. Field of the Invention

The subject matter disclosed herein generally relates to the manufacturing of integrated circuits, and, more particularly, to methods of forming a semiconductor structure wherein dopant profiles are created adjacent a feature formed on a substrate.

2. Description of the Related Art

Integrated circuits comprise a large number of individual circuit elements, such as transistors, capacitors and resistors. These elements are connected internally to form complex circuits, such as memory devices, logic devices and microprocessors. An improvement in the performance of integrated circuits requires a reduction of feature sizes. In addition to an increase in the speed of operation due to reduced signal propagation delays, reduced feature sizes allow increasing the number of functional elements in the circuit in order to extend its functionality.

FIG. 1b shows a schematic cross-sectional view of a field effect transistor 100 according to the state of the art. A substrate 101 comprises an active region 102. Shallow trench isolations 103, 104 isolate the active region 102 from neighboring circuit elements. A gate electrode 106 is formed over the substrate 101 and isolated from the substrate 101 by a gate insulation layer 105. The gate electrode 106 is flanked by sidewall spacers 117, 118.

Additionally, the field effect transistor 100 comprises an extended source region 109, an extended drain region 110, a source region 112 and a drain region 113. A portion of the extended source region 109, which is denoted as "source extension," and a portion of the extended drain region 110, denoted as "drain extension," extend below the sidewall spacers 117, 118 and are adjacent the gate electrode 106.

A method of forming the field effect transistor 100 is described with reference to FIGS. 1a and 1b. FIG. 1a shows a schematic cross-sectional view of the field effect transistor 100 in a first stage of the manufacturing process. First, the trench isolations 103, 104 and the active region 102 may be formed in the substrate 101. Then, the gate insulation layer 105 and the gate electrode 116 may be formed over the substrate 102. These structures may be formed using advanced techniques of ion implantation, deposition, oxidation and photolithography. In particular, the gate electrode 106 may be formed by photolithographically patterning a layer of material deposited over the substrate 101 and the gate insulation layer 105. Photolithography, which is well known to persons skilled in the art, comprises depositing a photoresist layer over the substrate 101 and exposing the photoresist layer.

After the formation of the gate electrode 106, the extended source region 109 and the extended drain region 110 may be formed by implanting ions of a dopant material into the substrate 101 adjacent the gate electrode 106. Parts of the substrate 101 outside the field effect transistor 100 which are not to be doped are covered by a layer of photoresist (not shown) which is configured to absorb ions.

After the formation of the extended source region 109 and the extended drain region 110, the sidewall spacers 117, 118 may be formed. To this end, a layer 111 of a spacer material may be conformally deposited over the substrate 101, e.g., by means of chemical vapor deposition (CVD). The spacer material may comprise silicon dioxide and/or silicon nitride. In conformal deposition, a local thickness of the deposited layer is substantially independent of a local slope of the surface on which it is deposited. In particular, the layer 111 has a substantially equal thickness on horizontal surfaces, such as the surface of the substrate 101 and the top surface of the gate electrode 106, and on vertical surfaces, such as the side surfaces of the gate electrode 106.

FIG. 1b shows a schematic cross-sectional view of the field effect transistor 100 in a later stage of the manufacturing process. The layer of spacer material 111 is etched anisotropically. In anisotropic etching, an etch rate in a vertical direction is greater than an etch rate in a horizontal direction. Therefore, portions of the layer of spacer material 111 whose surface is substantially horizontal, such as portions of the layer 111 on the top surface of the gate electrode 106 or on the surface of the substrate 101, are removed more quickly than inclined portions of the layer 111. In particular, portions of the layer 111 whose surface is substantially horizontal are removed more quickly than portions of the layer 111 whose surface is substantially vertical, such as portions of the layer 111 on the side surfaces of the gate electrode 106.

The etching of the layer 111 of the spacer material is stopped upon removal of the portions of the layer 111 having a horizontal surface. Due to the slower removal of portions of the layer 111 having a vertical surface, residues of these portions remain on the substrate and form the sidewall spacers 117, 118 adjacent the gate electrode 106. In some examples of methods of forming a field effect transistor according to the state of the art, the sidewall spacers 117, 118 may be part of one contiguous sidewall spacer structure running around the gate electrode 106.

Following the formation of the sidewall spacers 117, 118, the source region 112 and the drain region 113 may be formed by implantation of ions of a dopant material. The sidewall spacers 117, 118 absorb ions impinging on the sidewall spacers 117, 118. Therefore, the source region 112 and the drain region 113 may be provided at a greater distance to the gate electrode 106 than the extended source region 109 and the extended drain region 110. This allows the formation of a graded dopant profile, wherein the dopant profile below the sidewall spacers 117, 118 in the vicinity of the gate electrode 106 is relatively shallow and becomes deeper in the source region 112 and the drain region 113 which are provided at a greater distance to the gate electrode. As persons skilled in the art know, this may help to reduce short channel effects and, hence, may help to improve the performance of the field effect transistor 100 compared to a transistor wherein the source region 112 and the drain region 113 extend to the gate electrode 106.

In other examples of methods of manufacturing a field effect transistor according to the state of the art, further sidewall spacers may be formed adjacent the sidewall spacers 117, 118, and further implantations of dopant ions may be performed to create more sophisticated dopant profiles.

Finally, an annealing may be performed to activate dopants in the active region 102, the extended source region 109, the extended drain region 110, the source region 112 and the drain region 113.

A problem of the prior art method of forming a field effect transistor is that, in each of the processes employed in the formation of the sidewall spacers 117, 118, inhomogeneities may occur across the surface of the substrate 101, as well as between the processing of different substrates. Therefore, there may be a variation between dopant profiles in field effect transistors formed in different portions of the substrate 101, and between dopant profiles of field effect transistors formed on different substrates. Different dopant profiles, however, may entail different properties of the individual field effect transistors. This, in turn, may adversely affect the reproducibility of the method of manufacturing a field effect transistor according to the state of the art.

A further problem of the prior art method of forming a field effect transistor is that a loss of silicon in the substrate 101, as well as a loss of material of the shallow trench isolations 103, 104, may occur during the removal of the sidewall spacers 117, 118. This may also lead to a loss of dopants in regions in the vicinity of the gate electrode 106.

Yet another problem of the method of forming a field effect transistor according to the state of the art is that the sidewall spacers 117, 118 occupy an amount of space in the vicinity of the gate electrode 106. As the size of the field effect transistor 100 is reduced, it may be desirable to use this amount of space for different purposes, for example for forming electrical connections to the field effect transistor 100, or it may be desirable to provide a stress-creating layer in the vicinity of the gate electrode 106. As persons skilled in the art know, stress-creating layers may be employed to provide a compressive or tensile stress in a channel region of the field effect transistor 100 below the gate electrode 106, which may improve the mobility of electrodes and/or holes in the channel regions.

Therefore, it has been proposed to remove the sidewall spacers 117, 118 after the formation of the source region 112 and the drain region 113. This may be done by means of an etching process adapted to selectively remove the spacer material. The removal of the sidewall spacers 117, 118, however, may require further processing steps, which may increase the complexity of the formation of the field effect transistor 100. Moreover, the field effect transistor 100 may be damaged during the etching process.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment disclosed herein, a method of forming a semiconductor structure comprises providing a semiconductor substrate. A feature is formed over the substrate. The feature is substantially homogeneous in a lateral direction. A first ion implantation process adapted to introduce first dopant ions into at least one portion of the substrate adjacent the feature is performed. The length of the feature in the lateral direction is reduced. After the reduction of the length of the feature, a second ion implantation process adapted to introduce second dopant ions into at least one portion of the substrate adjacent the feature is performed.

According to another illustrative embodiment disclosed herein, a method of forming a field effect transistor comprises providing a semiconductor substrate. A gate electrode is formed over the substrate. A length of the gate electrode is greater than a desired gate length. A first ion implantation process adapted to introduce first dopant ions into the substrate adjacent the gate electrode is performed to form a source region and a drain region. The length of the gate electrode is reduced to a length being approximately equal to the desired gate length. After the reduction of the length of the gate electrode, a second ion implantation process adapted to introduce second dopant ions into the substrate adjacent the gate electrode is performed to form an extended source region and an extended drain region.

BRIEF DESCRIPTION OF THE DRAWINGS

The disclosure may be understood by reference to the following description taken in conjunction with the accompanying drawings, in which like reference numerals identify like elements, and in which.

Figure 1A:
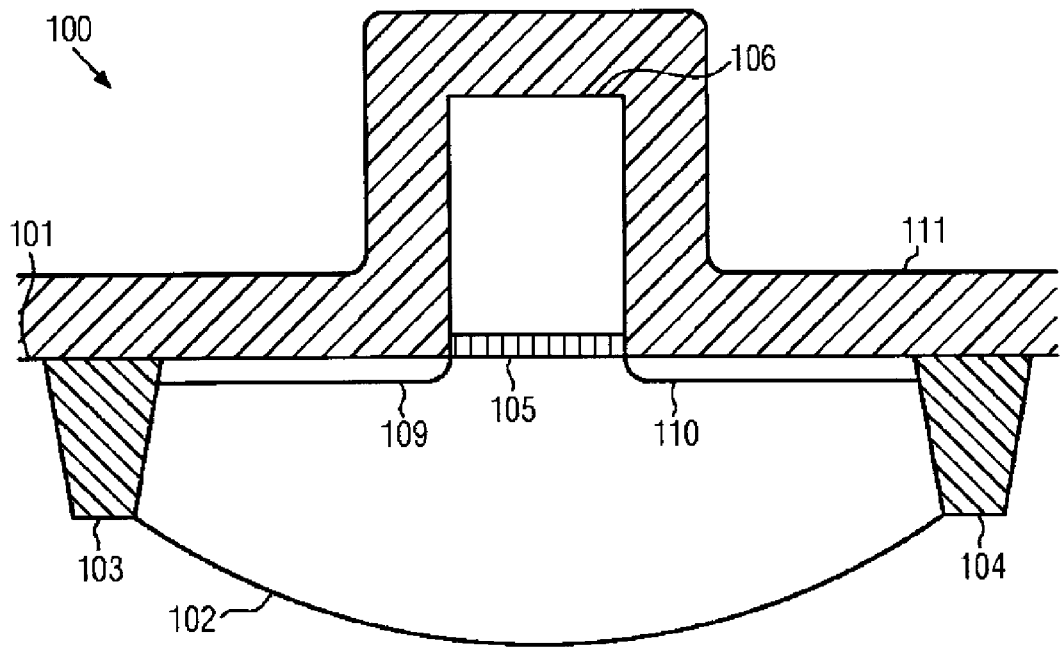
FIGS. 1a-1b show schematic cross-sectional views of a field effect transistor in stages of a manufacturing process according to the state of the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In one embodiment disclosed herein, the present disclosure is directed to spacerless methods of manufacturing a semiconductor structure wherein doped regions comprising portions having a different dopant profile and/or different depth are formed adjacent a feature formed over a substrate.

To this end, the feature is formed with a length being greater than a desired final length of the feature, and a first ion implantation process adapted to introduce first dopant ions into the substrate is performed. The feature may absorb a portion of the first dopant ions impinging on the feature. Hence, substantially no dopant ions are introduced into a portion of the substrate below the feature, whereas first dopant ions impinging adjacent the feature are incorporated into the substrate. Thus, a first doped region is formed adjacent the feature.

Thereafter, the length of the feature is reduced, for example by means of an etching process. Thus, portions of the substrate which were covered by the feature during the first ion implantation process are exposed. Then, a second ion implantation process adapted to introduce second dopant ions into the substrate is performed to form a second doped region adjacent the feature. In the second ion implantation process, ions impinging on the feature are absorbed. Since, however, the length of the feature has been reduced, ions are introduced into portions of the substrate which were covered by the feature in the first ion implantation process. Second dopant ions which are incorporated into the substrate thus form a second doped region which extends further towards the feature than the first doped region.

Figure 1B:
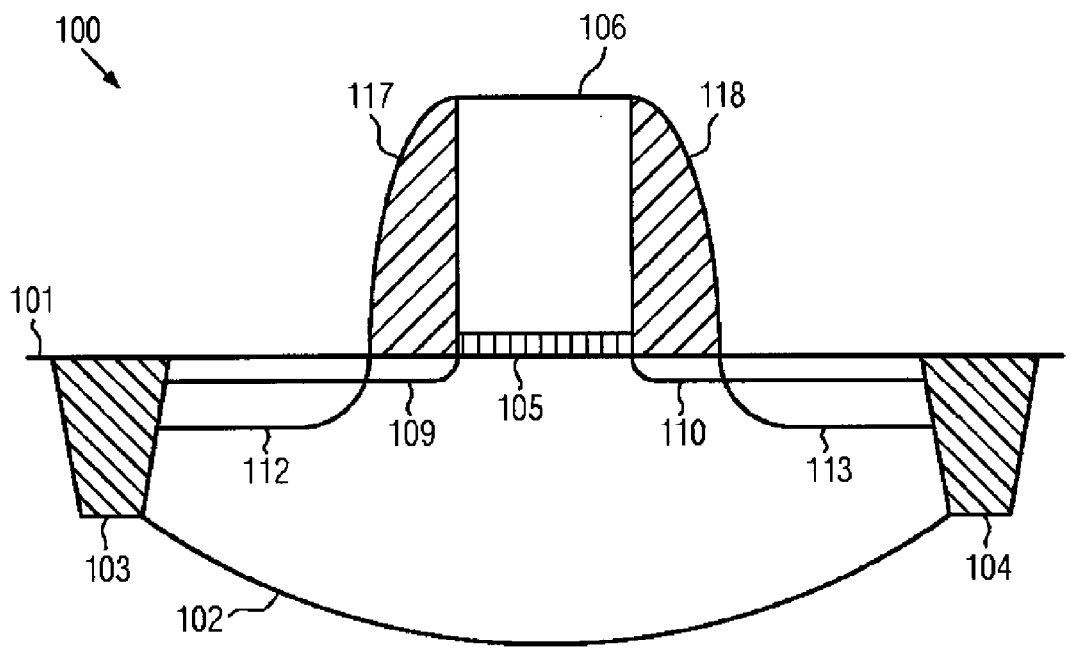

In some embodiments, the feature may be a gate electrode of a field effect transistor, the first doped region may comprise a source region and/or a drain region of the field effect transistor, and the second doped region may comprise an extended source region and/or an extended drain region of the field effect transistor. In such embodiments, the second dopant ions may be implanted to a smaller depth than the first dopant ions, and the dose of the second dopant ions, as well as the energy of the second dopant ions, may be different from the dose and the energy of the first dopant ions. For example, the dose of the second dopant ions may be smaller than the dose of the first dopant ions, and the energy of the second dopant ions may be smaller than the energy of the first dopant ions. Hence, source and drain regions similar to the source region 112, the drain region 113, the extended source region 109 and the extended drain region 110 of the field effect transistor 100 described above with reference to FIGS. 1a-1b may be formed without using sidewall spacers.

Advantageously, this reduces the effort of producing a semiconductor structure comprising field effect transistors, and the number of processing steps in a sensitive area of manufacturing may be reduced. This may help improve the stability of the field effect transistors.

Figure 2A:
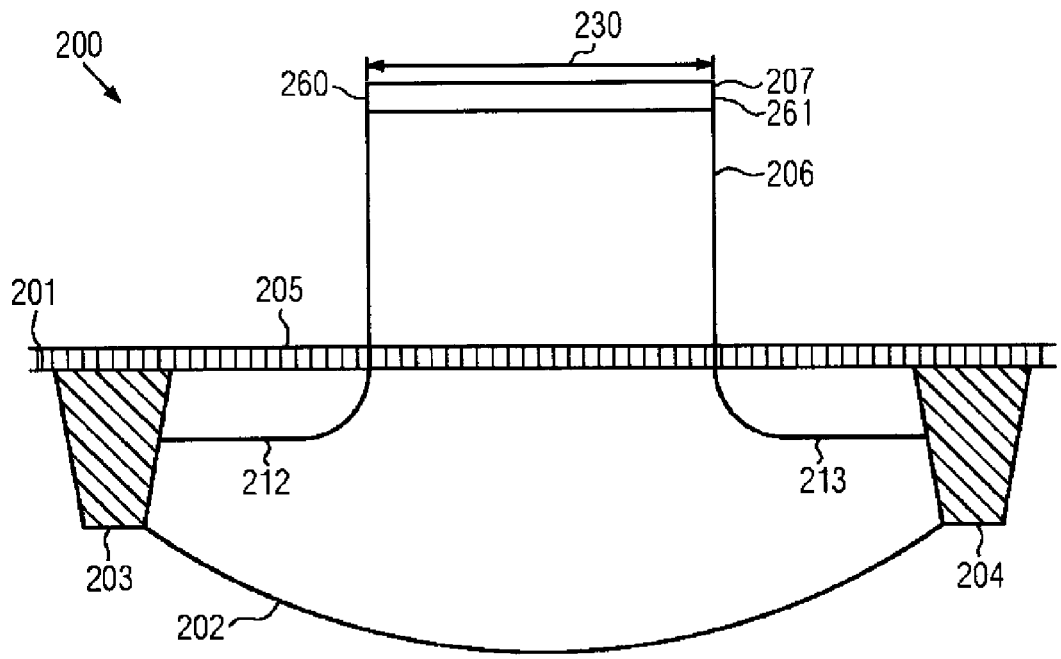
FIGS. 2a-2c show schematic cross-sectional views of a semiconductor structure in stages of a manufacturing process according to one embodiment disclosed herein.

FIG. 2a shows a schematic cross-sectional view of a semiconductor structure 200 wherein a field effect transistor is to be formed in a first stage of a manufacturing process according to one illustrative embodiment disclosed herein. The semiconductor structure 200 comprises a semiconductor substrate 201 which may, in some embodiments, comprise silicon. An active region 202 is formed in the substrate 201. Shallow trench isolations 203, 204, which may be part of one contiguous isolation structure, electrically insulate the active region 202 from other circuit elements (not shown) formed in the semiconductor structure 200. The active region 201 and the shallow trench isolations 203, 204 may be formed by means of techniques of ion implantation, etching, deposition and/or oxidation, which are well known to persons skilled in the art.

A gate insulation layer 205 may be formed over the semiconductor structure 200. In some embodiments, the gate insulation layer 205 may comprise silicon dioxide. In other embodiments, the gate insulation layer 205 may comprise silicon nitride, silicon oxynitride or another dielectric material known to persons skilled in the art. The gate insulation layer 205 may be formed by means of known deposition techniques, such as chemical vapor deposition (CVD) and/or plasma enhanced chemical vapor deposition (PECVD). In embodiments where the gate insulation layer 205 comprises silicon dioxide and the substrate 201 comprises silicon, the gate insulation layer 205 may be formed by means of techniques of oxidation, well known to persons skilled in the art, comprising rapid thermal oxidation or oxidation in a furnace comprising oxygen.

A feature, which may, in some embodiments, comprise a gate electrode 206, is formed over the semiconductor structure 200. To this end, a layer of a gate electrode material, such as, for example, polycrystalline silicon, may be deposited over the gate insulation layer 205, for example by means of CVD and/or PECVD. Thereafter, the layer of gate electrode material may be patterned. To this end, a hard mask 207 may be formed over portions of the semiconductor structure 200 at which the gate electrode 206 is to be formed.

The hard mask 207 may comprise a mask material such as silicon dioxide, silicon nitride and/or silicon oxynitride. In some embodiments, the hard mask 207 may comprise a different material than the gate insulation layer 205. In order to form the hard mask 207, a layer of the mask material may be formed over the layer of gate electrode material. Subsequently, the layer of mask material may be patterned by means of techniques of photolithography, well known to persons skilled in the art.

The hard mask 207 may have a first length 230, wherein the first length 230 denotes a lateral extension of the mask 207 in a length direction substantially parallel to a surface of the substrate 201. Thereafter, an etching process adapted to selectively remove portions of the layer of gate electrode material which are not covered by the hard mask 207 is performed. An etchant used in the etching process may be adapted such that the gate electrode material is selectively removed and the hard mask 207, as well as the gate insulation layer 205, remain substantially intact. Thus, the hard mask 207 protects portions of the layer of gate electrode material from being affected by the etchant, and the gate insulation layer 205 protects the substrate 201 from being affected by the etchant. The etching process may be an anisotropic etch process, for example a known dry etching process. Thus, removal of portions of the layer of gate electrode material below the mask 207 may be substantially avoided, and a gate electrode 206 having a length substantially equal to the first length 230 may be formed. The gate insulation layer 205 may act as an etch stop layer, protecting portions of the substrate 201 below the gate insulation layer 205 from being affected by the etchant used in the anisotropic etching process.

The layer of gate electrode material may be substantially homogeneous in a lateral direction. In particular, the layer of gate electrode material may be substantially homogeneous in the length direction. Thus, the gate electrode 206 may also be substantially homogeneous in the length direction.

After the formation of the gate electrode 206, a first ion implantation process may be performed. In the first ion implantation process, the semiconductor structure 200 may be irradiated with a beam of first dopant ions. The first dopant ions may comprise ions of a dopant material known to persons skilled in the art, for example, ions of boron and/or arsenic.

During the first ion implantation process, the gate electrode 206 and the mask 207 absorb ions impinging on the gate electrode 206 and/or the mask 207. Therefore, portions of the substrate 201 below the gate electrode 206 are protected from being irradiated with the first dopant ions.

Ions which impinge on portions of the substrate 201 other than the gate electrode 206 and the mask 207, however, may be incorporated into the substrate 201. Thus, a doped source region 212 and a doped drain region 213 may be formed adjacent the gate electrode 206. A depth of the source region 212 and the drain region 213 may be controlled by adjusting an ion dose and an ion energy of the first ion implantation process. In some embodiments, the ion dose and the ion energy may be substantially equal to an ion energy and an ion dose applied in the formation of the source region 112 and the drain region 113 in the manufacturing process according to the state of the art described above with reference to FIGS. 1a-1b.

Figure 2B:
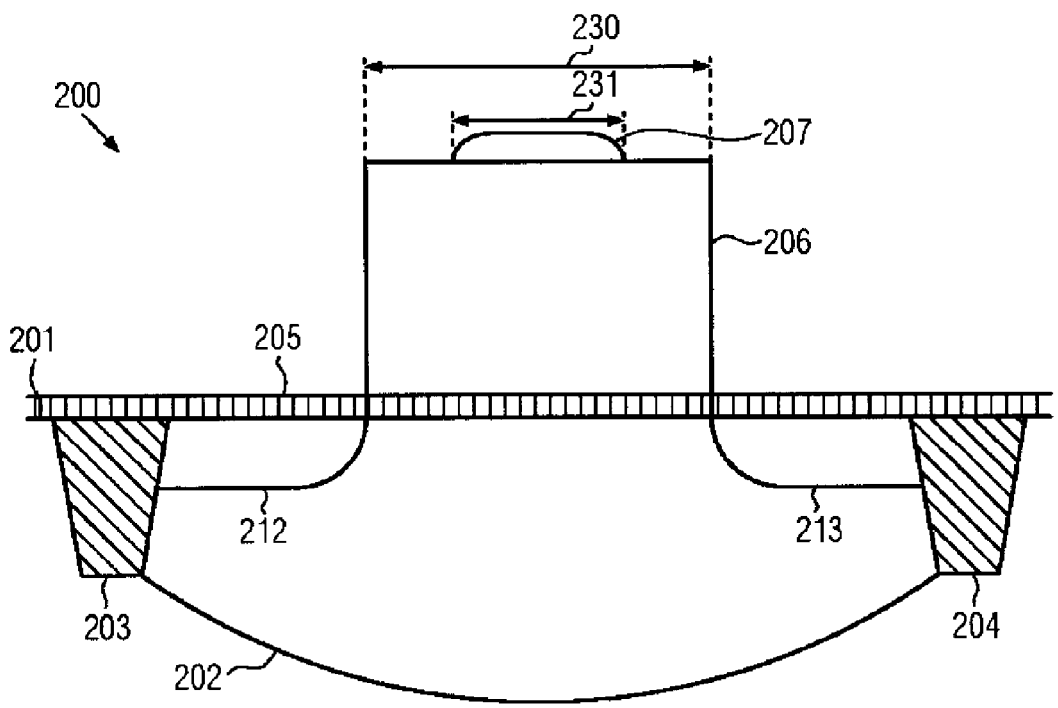

FIG. 2b shows a schematic cross-sectional view of the semiconductor structure 200 in a further stage of the method according to one illustrative embodiment disclosed herein. The length of the gate electrode 206 may be reduced. The reduction of the length of the gate electrode 206 may comprise a reduction of the length of the hard mask 207. For this purpose, an etching process may be employed. In the etching process, the semiconductor structure 200 may be exposed to an etchant adapted to selectively remove the material of the mask 207, leaving the material of the gate electrode 206, the gate insulation layer 205 and the shallow trench isolations 203, 204 substantially intact. Thus, the gate insulation layer 205 may protect the substrate 201 from being affected by the etchant.

The etching process used in the reduction of the length of the mask 207 may be substantially isotropic, or may be an anisotropic etching process having a relatively low degree of anisotropy. Thus, side surfaces 260, 261 of the hard mask 207 are etched and the mask 207 obtains a second length 231 being smaller than the first length 230. In the etching process, a thickness of the mask 207 may also be reduced. The reduction of the thickness of the mask 207 may be taken into account by forming the layer of mask material with a thickness adapted such that a sufficient thickness of the mask 207 is obtained after the reduction of the length of the mask 207.

Figure 2C:
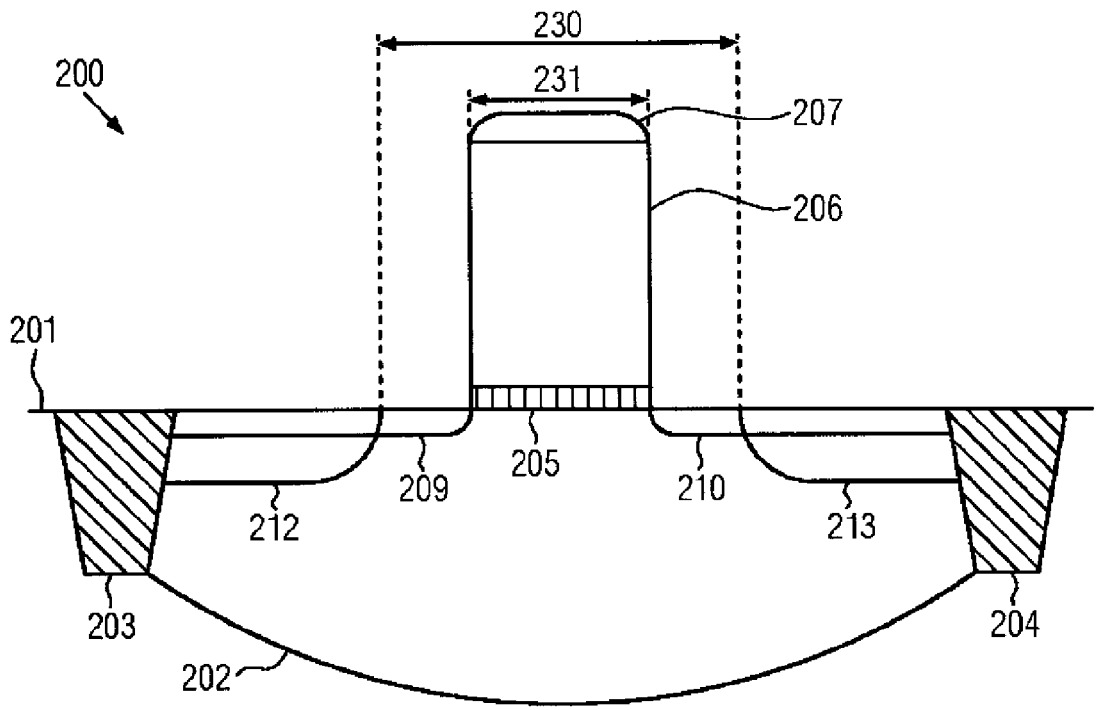

A schematic cross-sectional view of the semiconductor structure 200 in a later stage of manufacturing is shown in FIG. 2c. After the reduction of the length of the mask 207, an anisotropic etching process adapted to selectively remove the material of the gate electrode 206, leaving the materials of the mask 207 and the gate insulation layer 205 substantially intact, may be performed. In some embodiments, the anisotropic etching process may be substantially identical to the above-described etching process employed in the formation of the gate electrode 206. In the anisotropic etching process, the mask 207 protects portions of the gate electrode 206 below the mask 207 from being affected by the etchant. Portions of the gate electrode 206 adjacent the source region 212 and the drain region 213, however, which are not covered by the mask 207, may be removed in the anisotropic etching process. Thus, the gate electrode 206 obtains a reduced length which may be approximately equal to the second length 231 of the mask 207. The gate insulation layer 205 may act as an etch stop layer, protecting the substrate 201 from being affected by the etchant.

After the reduction of the length of the gate electrode 206, a second ion implantation process may be performed. In the second ion implantation process, the semiconductor structure 200 may be irradiated with ions of a second dopant. The second dopant may be a dopant known to persons skilled in the art, such as arsenic or boron. The gate electrode 206 and the mask 207 absorb ions of the second dopant impinging thereon. Thus, substantially no second dopant ions are introduced into portions of the substrate 201 below the gate electrode 206.

Second dopant ions, however, may be introduced into portions of the substrate 201 adjacent the gate electrode 206. Thus, an extended source region 209 and an extended drain region 210 may be formed. The extended source region 209 and the extended drain region 210 may comprise portions of the substrate 201 which were covered by the gate electrode 206 during the first ion implantation process, and, hence, may extend more closely to the gate electrode 206 than the source region 212 and the drain region 213. The extended source region 209 and the extended drain region 210 may have a lower depth than the source region 212 and the drain region 213, and a dopant concentration in the extended source region 209 and the extended drain region 210 may be lower than a dopant concentration in the source region 212 and the drain region 213. In some embodiments, the dose and the energy of the second dopant ions may be approximately equal to the ion dose and the ion energy applied in the formation of the extended source region 109 and the extended drain region 110 in the method according to the state of the art described above with reference to FIGS. 1a-1b.

Thus, the subject matter disclosed herein allows the formation of the source region 212, the drain region 213, the extended source region 209 and the extended drain region 210 without using sidewall spacers. Therefore, compared to the method according to the state of the art described above with reference to FIGS. 1a-1b, an effort of the production of the semiconductor structure 200 may be reduced, since a smaller number of individual manufacturing steps may be required compared to the method according to the state of the art.

In some embodiments, portions of the gate insulation layer 205 which are not covered by the gate electrode 206 may be removed after the formation of the extended source region 209 and the extended drain region 210. In other embodiments, the portions of the gate insulation layer 205 which are not covered by the gate electrode 206 may be removed before the formation of the extended source region 209 and the extended drain region 210. For removing the portions of the gate insulation layer 205, an etching process adapted to selectively remove the material of the gate insulation layer 205, leaving the materials of the gate electrode 206 and the substrate 201 substantially intact, may be performed.

Figure 3A:
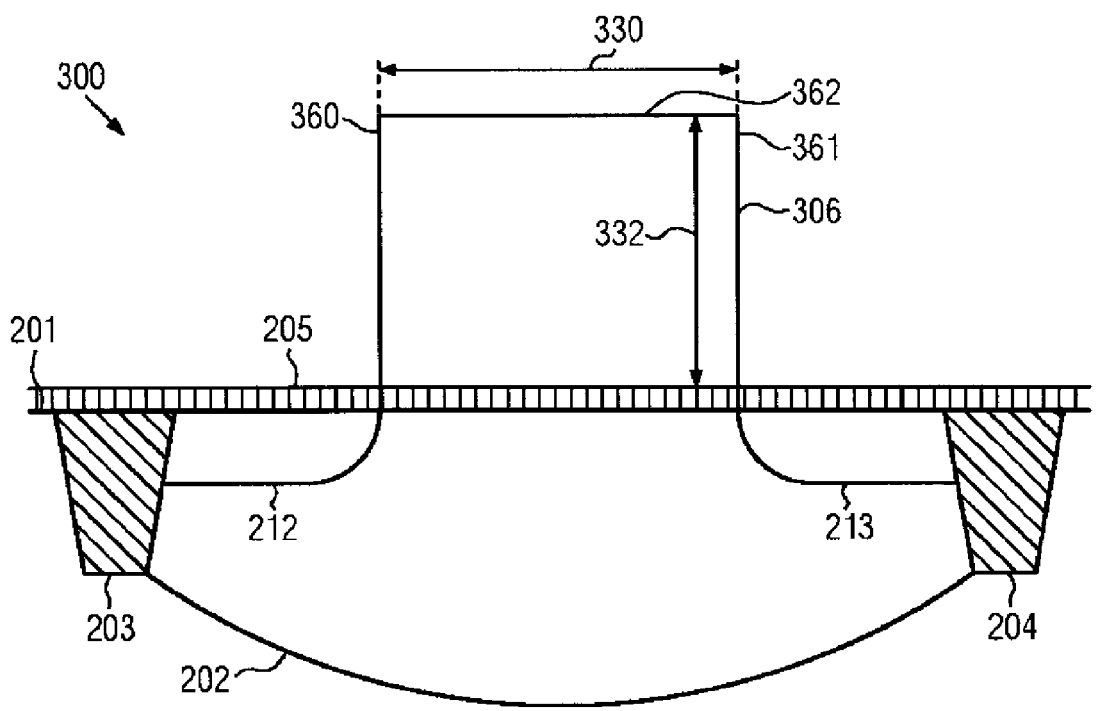
FIGS. 3a-3b show schematic cross-sectional views of a semiconductor structure in stages of a manufacturing process according to another embodiment disclosed herein.

FIG. 3a shows a schematic cross-sectional view of a semiconductor structure 300 in a first stage of a method of manufacturing a semiconductor structure according to one illustrative embodiment disclosed herein. For convenience, in FIG. 3a, as well as in FIG. 3b, identical reference numerals as in FIGS. 2a-2c have been used in order to denote corresponding elements of the semiconductor structures 200, 300.

The semiconductor structure 300 comprises a substrate 201. An active region 201 and shallow trench isolations 203, 204 are formed in the substrate 201. A gate insulation layer 205 is formed over the substrate 201.

Figure 3B:
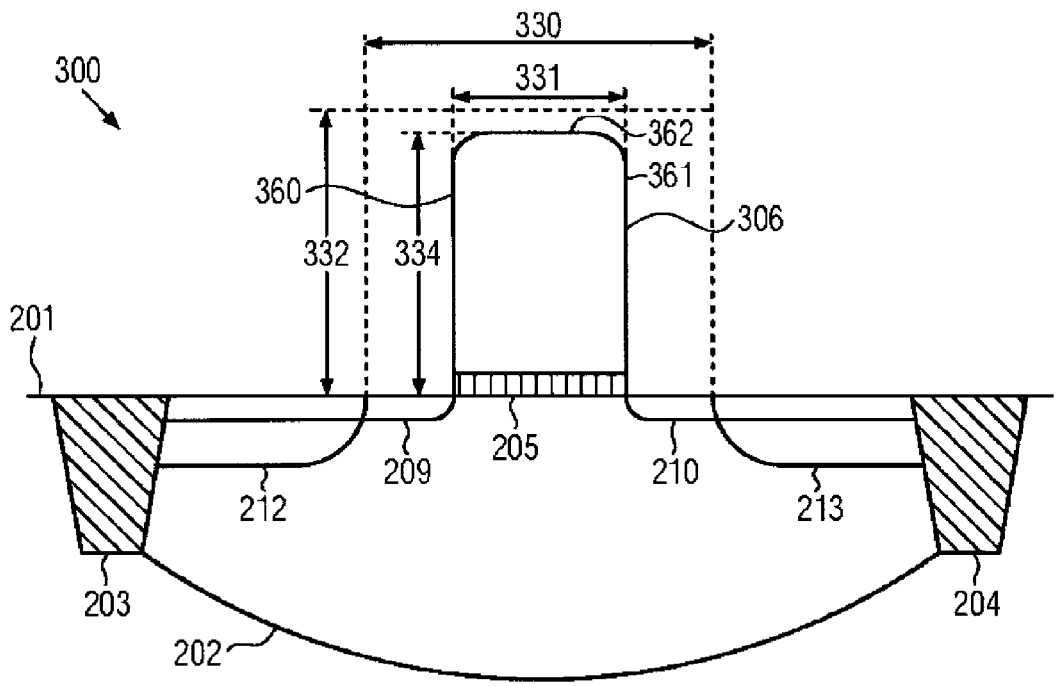

FIG. 3b shows a schematic cross-sectional view of the semiconductor structure 300 in a later stage of the manufacturing process. After the formation of the source region 212 and the drain region 213, the length of the gate electrode 306 is reduced. To this end, an etching process, which may be an isotropic etching process or an anisotropic etching process having a relatively low degree of anisotropy, may be performed. The etching process may be a dry etching process, wherein parameters of the etching process may be adapted such that a low degree of anisotropy of etching is obtained. In other embodiments, the etching process may be a wet etching process. As persons skilled in the art know, wet etching processes may be substantially isotropic. The etchant used in the etching process may be adapted to remove the material of the gate electrode 306, leaving the material of the gate insulation layer 205 substantially intact. Thus, the gate insulation layer 205 may protect the substrate 201 from being affected by the etchant.

Due to the isotropy or the low degree of anisotropy of the etching process, respectively, the etching process may remove material both from side surfaces 360, 361 and a top surface 362 of the gate electrode 306. Thus, in the etching process, the length of the gate electrode 306 may be reduced from the first length 330 to a second length 331. Additionally, the height of the gate electrode 306 may be reduced from the first height 332 to a second height 334. The reduction of the height of the gate electrode 306 may be taken into account by correspondingly increasing the thickness of the layer of gate electrode material and the first height 332 of the gate electrode 306, respectively. The second height 334 of the gate electrode 306 may be approximately equal to a desired height of the gate electrode 306.

After the reduction of the length and height of the gate electrode 306, an extended source region 209 and an extended drain region 210 may be formed by means of a second ion implantation process wherein second dopant ions are directed to the semiconductor structure 300. The second ion implantation process may be similar to the second ion implantation process performed in the embodiments described above with reference to FIGS. 2a-2c.

Before or after the formation of the extended source region 209 and the extended drain region 210, portions of the gate insulation layer 205 which are not covered by the gate electrode 306 may be removed, for example, by means of an etching process adapted to selectively remove the material of the gate insulation layer 205, leaving the materials of the substrate 201 and the gate electrode 306 substantially intact.

Advantageously, in this embodiment, the formation of the mask 207 may be avoided. Thus, the complexity of the manufacturing of the semiconductor structure 300 may be performed in a simpler and more cost-effective manner.

Figure 4:
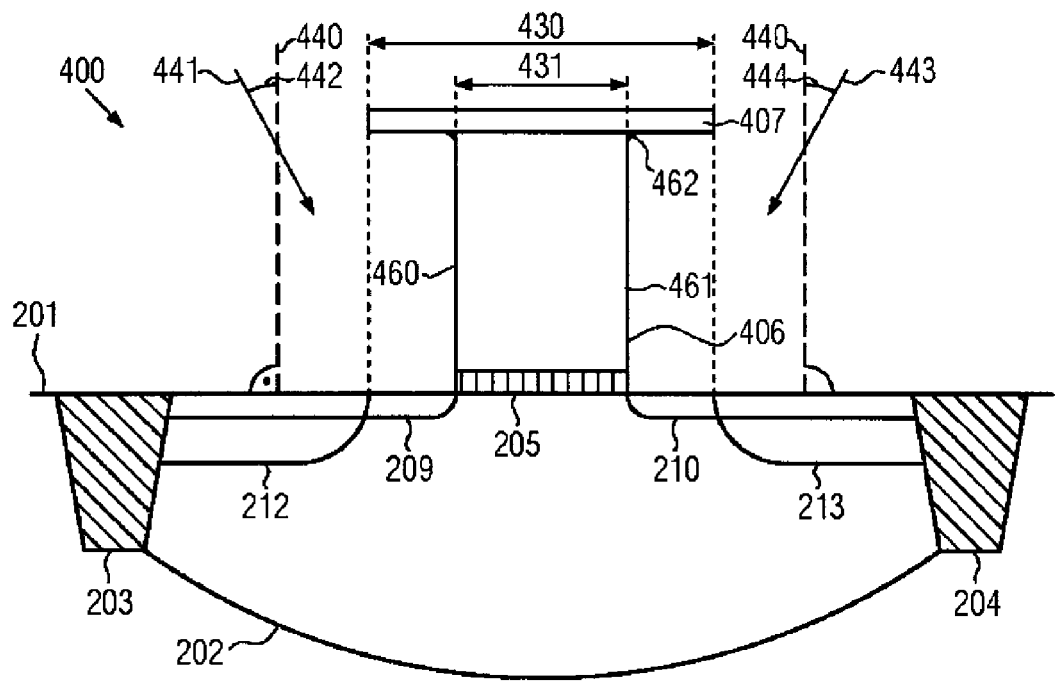
FIG. 4 shows a schematic cross-sectional view of a semiconductor structure during a manufacturing process according to yet another embodiment disclosed herein.

Further embodiments will be described with reference to FIG. 4, showing a schematic cross-sectional drawing of a semiconductor structure 400 in a stage of a manufacturing process according to another illustrative embodiment. For convenience, in FIG. 4, and in FIGS. 2a-2c, as well as in FIGS. 3a-3b, like reference numerals have been used in order to denote like elements of the semiconductor structures.

The semiconductor structure 400 comprises a semiconductor substrate 201. An active region 202 and shallow trench isolations 203, 204 are formed in the semiconductor substrate 201. Moreover, similar to the embodiments described above with reference to FIGS. 2a-3b, a gate insulation layer 205 may be formed over the substrate 201. This may be done by means of techniques of ion implantation, etching, photolithography, oxidation and deposition, well known to persons skilled in the art.

A gate electrode 406 may be formed over the semiconductor structure 400. Similar to the embodiments described above with reference to FIGS. 2a-2c, the formation of the gate electrode 406 may comprise a deposition of a layer of a gate material, which may be substantially homogeneous, at least in a lateral direction, over the semiconductor structure 400. Thereafter, a hard mask 407 may be formed over the layer of gate electrode material and an anisotropic etching process, which may be a dry etching process, may be performed to remove portions of the layer of gate electrode material which are not covered by the mask 407. After the anisotropic etching process, the gate electrode 407 may have a first length 430.

After the formation of the gate electrode 406, similar to the embodiments described above with reference to FIGS. 2a-2c, a first ion implantation process may be performed to form a source region 212 and a drain region 213 in the substrate 201. Since the gate electrode 406 and the hard mask 207 absorb second dopant ions impinging thereon, the source region 212 and the drain region 213 may be spaced apart by a distance being approximately equal to the first length 430.

After the formation of the source region 212 and the drain region 213, an etching process, which may be a substantially isotropic etching process or an anisotropic etching process having a low degree of anisotropy, may be performed. The etching process may be a dry etch process or a wet etch process. An etchant used in the etching process may be adapted to selectively remove the gate electrode material, leaving the materials of the hard mask 407 and the gate insulation layer 205, which, in this stage of the method, may still cover the entire surface of the substrate 201, substantially intact. Thus, the hard mask 407 and the gate insulation layer 205 protect the substrate 201 and a top surface 462 of the gate electrode 406 from being affected by the etchant. Due to the isotropy or low degree of anisotropy of the etching process, however, sidewalls of the gate electrode 406 may be affected by the etchant. Therefore, the length of the gate electrode 406 may be reduced to a second length 431 being smaller than the first length 430. Since the material of the hard mask 407 is affected by the etchant to a less extent than the material of the gate electrode 406, the length of the hard mask 407 after the etching process may be substantially equal to the first length 430. Thus, after the etching process, the gate electrode 406 covered by the hard mask 407 may have a mushroom-shaped configuration wherein portions of the hard mask 407 protrude over the gate electrode 406.

After the reduction of the length of the gate electrode 405, a second ion implantation process may be performed to introduce second dopant ions into the semiconductor structure 200 in order to form an extended source region 209 and an extended drain region 210 adjacent the gate electrode 406.

In some embodiments, in the second ion implantation process, an ion beam comprising the second ions may be directed to the semiconductor structure 200 from a first direction of incidence 443 being oblique to a normal direction 440 of the substrate 201. The first direction of incidence 443 and the normal direction 440 may include an angle 444 in a range from about 20-70 degrees. Thus, a shadowing of portions of the substrate 201 below the protruding portions of the hard mask 407 may be substantially avoided or at least reduced.

During the second ion implantation, the semiconductor structure 400 may be rotated around an axis being substantially parallel to the normal direction 440. After a half revolution of the semiconductor structure 400, the second dopant ions impinge from a second direction of incidence 441, wherein an angle 442 between the second direction of incidence 441 and the normal direction 440 may be approximately equal to the angle 444 between the first direction of incidence 443 and the normal direction 440. Thus, a more symmetrical configuration of the extended source region 209 and the extended drain region 210 may be obtained.

In other embodiments, the hard mask 407 may be removed before the formation of the extended source region 209 and the extended drain region 210 to avoid a shadowing of portions of the substrate 201 by the protruding portions of the hard mask. This may be done by means of an etching process adapted to selectively remove the material of the hard mask layer, leaving the material of the gate electrode 406 and other features on the surface of the semiconductor structure 400 substantially intact.

Portions of the gate insulation layer 205 which are not covered by the gate electrode 406 may be removed from the surface of the substrate 406. While, in some embodiments, the portions of the gate insulation layer 205 may be removed before the formation of the extended source region 209 and the extended drain region 210, in other embodiments, the portions of the gate insulation layer 205 may be removed after the formation of the extended source region 209 and the extended drain region 210.

In further embodiments, the portions of the gate insulation layer 205 which are not covered by the gate electrode 406 and the hard mask 407 may be removed simultaneously by means of one etching process adapted to remove the materials of the gate insulation layer 205 and the hard mask 407, leaving the materials of the gate electrode 406 and the substrate 201 substantially intact. In such embodiments, the hard mask 207 and the gate insulation layer 205 may be formed from substantially the same material.

The embodiments described with reference to FIG. 4 may advantageously reduce the complexity of the manufacturing process compared to the embodiments described with reference to FIGS. 2a-2c, since the step of reducing the length of the hard mask may be omitted.

The feature, the length of which is reduced between the first ion implantation process and the second ion implantation process, need not be a gate electrode of a field effect transistor. Instead, in some embodiments, which will be described with reference to FIGS. 5a-5d, a placeholder element may be used instead of a gate electrode.

Figure 5A:
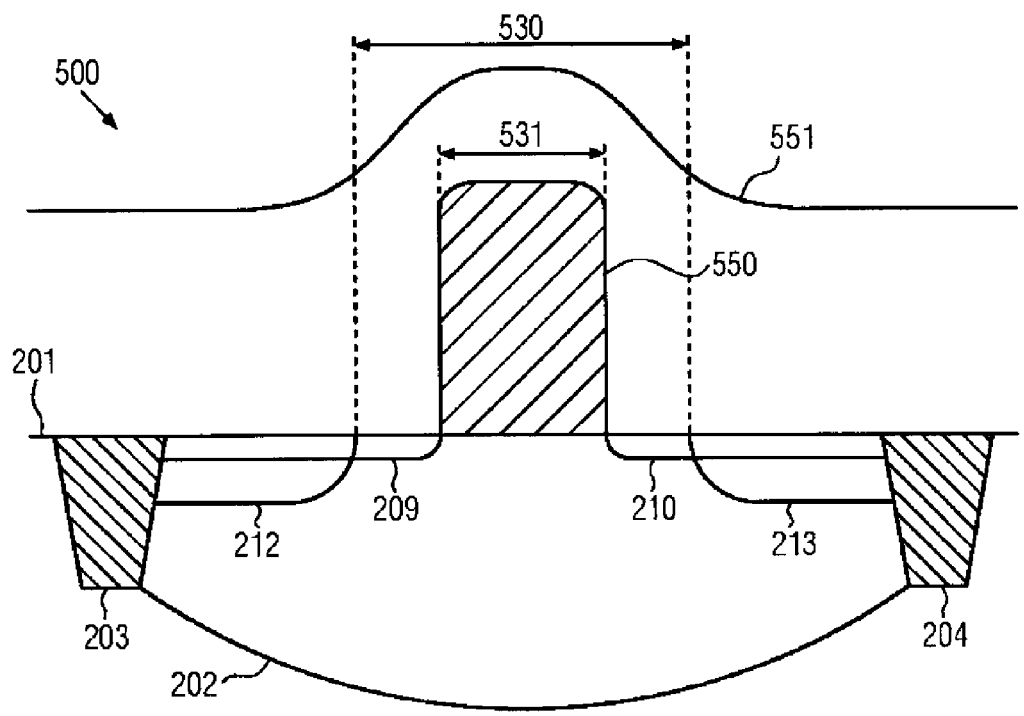
FIGS. 5a-5d show schematic cross-sectional views of a semiconductor structure in stages of a manufacturing process according to yet another embodiment disclosed herein.

FIG. 5a shows a schematic cross-sectional view of a semiconductor structure 500 in a first stage of a method according to another illustrative embodiment. Similar to the embodiments described above with reference to FIGS. 2a-4, the semiconductor structure 500 comprises a substrate 201 in which an active region 201 and shallow trench isolations 203, 204 are formed.

A placeholder element 550 may be formed over the active region 202, between the shallow trench isolations 203, 204. The placeholder element 550 may be formed by depositing a layer of a placeholder element material over the semiconductor structure 500 and patterning the layer of placeholder element material by means of known techniques of photolithography. After its formation, the placeholder element 550 may have a first length, as indicated by reference numeral 530 in FIG. 5a.

In some embodiments, the placeholder element material may comprise a dielectric material such as, for example, silicon dioxide, silicon nitride or silicon oxynitride. In other embodiments, the placeholder element material may comprise an electrically conductive material such as, for example, polycrystalline silicon.

After the formation of the placeholder element 550, a first ion implantation process adapted to implant first dopant ions into the substrate 201 may be performed. During the first ion implantation process, the placeholder element 550 absorbs ions impinging on the placeholder element 550. Thus, a source region 212 and a drain region 213 separated from each other by a distance being approximately equal to the first length 530 of the placeholder element 550 may be formed in the active region 202.

After the formation of the source region 212 and the drain region 213, the length of the placeholder element 550 may be reduced. For this purpose, an etching process, which may be substantially isotropic or may have a low degree of anisotropy, may be performed. In the etching process, the length of the placeholder element 550 may be reduced from the first length 530 to a second length 531. Additionally, during the etching process, the height of the placeholder element may also be reduced. In other embodiments, a hard mask may be formed on the placeholder element 550 in order to avoid a reduction of the height of the placeholder element 550.

After the reduction of the length of the placeholder element 550, a second ion implantation process adapted to introduce second dopant ions into the substrate 201 may be performed to form an extended source region 209 and an extended drain region 210 adjacent the placeholder element 550, wherein the extended source region 209 and the extended drain region 210 are separated by a distance being approximately equal to the second length 531 of the placeholder element 550.

Thereafter, a first material layer 551, which may, in some embodiments, comprise a dielectric material such as silicon dioxide or silicon nitride, may be formed over the semiconductor substrate 201. In embodiments wherein the placeholder material comprises one of silicon dioxide or silicon nitride, the first material layer 551 may comprise the other of silicon dioxide and silicon nitride. This may be done by means of deposition techniques well known to persons skilled in the art, such as chemical vapor deposition or plasma enhanced chemical vapor deposition. A thickness of the first material layer 551 may be greater than the height of the placeholder element 550.

Figure 5B:
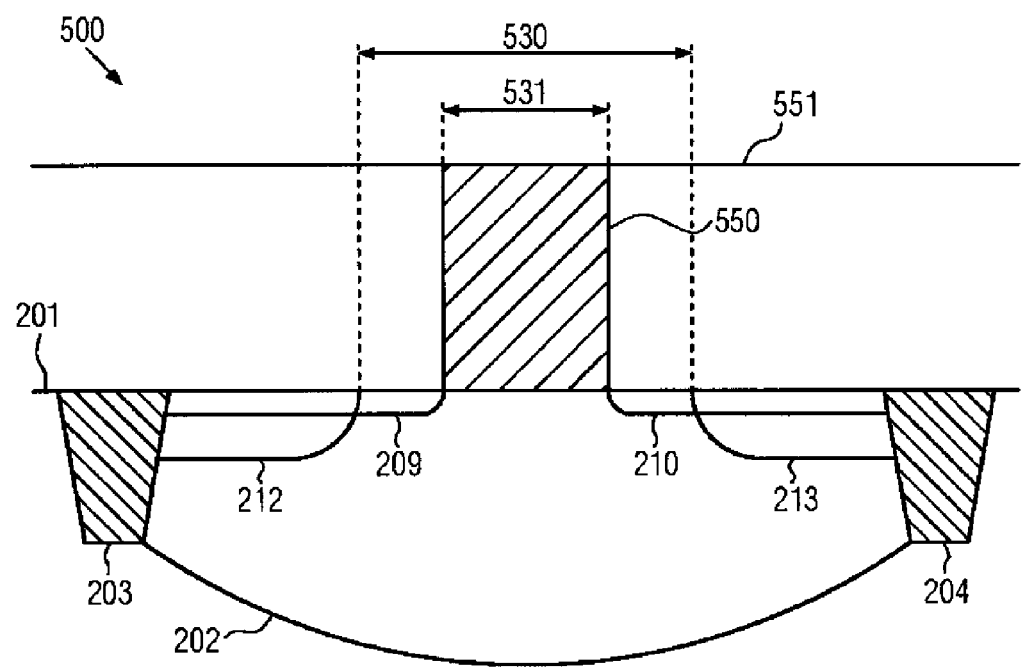
Figure 5C:
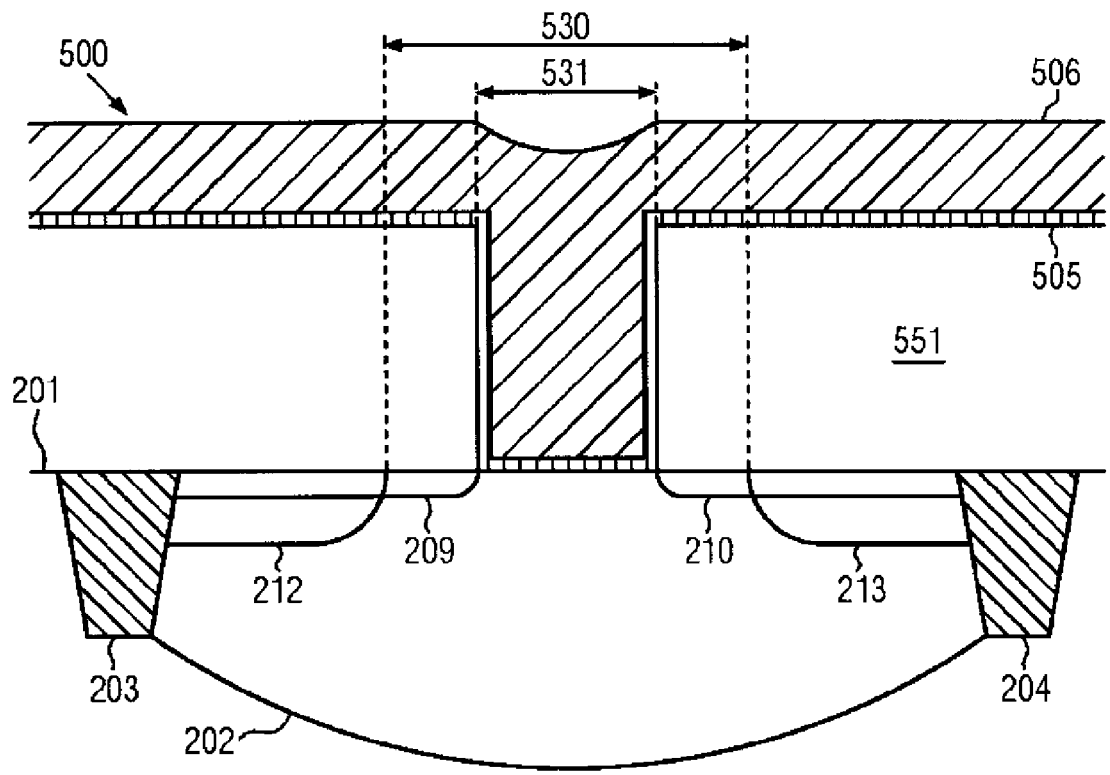

FIG. 5b shows a schematic cross-sectional view of the semiconductor structure 500 in a later stage of the method disclosed herein. A first planarization process is performed. In some embodiments, the first planarization process may be a chemical mechanical polishing process. As persons skilled in the art know, in chemical mechanical polishing, the semiconductor structure 500 is moved relative to a surface of a polishing pad. A slurry comprising abrasives and chemical compounds adapted to react chemically with materials on the surface of the semiconductor structure 500 is supplied to an interface between the semiconductor structure 500 and the polishing pad. Reaction products are removed by the abrasives.

In the planarization process, portions of the first material layer 551 over the placeholder element 550 may be removed. Thus, a substantially planar surface of the semiconductor structure 550 may be obtained, wherein a top surface of the placeholder element 550 may be exposed at the surface of the semiconductor structure 500.

Figure 5D:
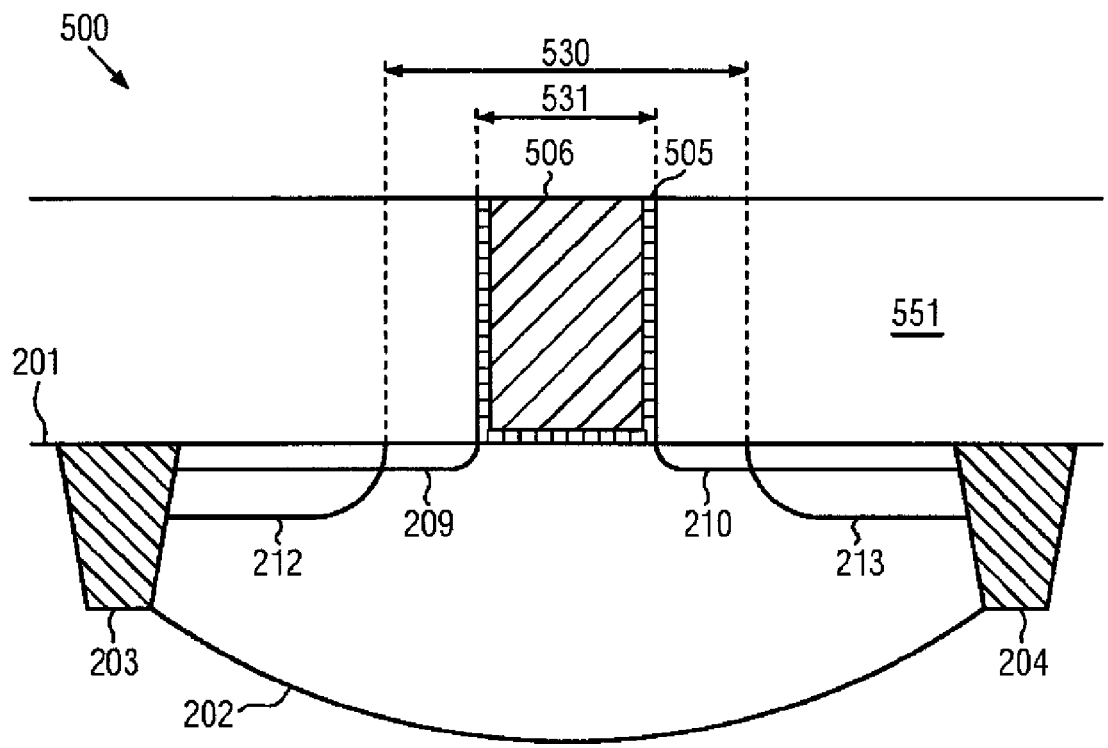

FIG. 5d shows a schematic cross-sectional view of the semiconductor structure 500 in a later stage of the manufacturing process. After the first planarization process, the placeholder element 550 may be removed, for example by means of an etching process adapted to selectively remove the material of the placeholder element 550, leaving the materials of the first material layer 551 and the substrate 201 substantially intact. Thus, at the location of the placeholder element 550, an opening is obtained in the first material layer 551.

Thereafter, a gate insulation layer 505 and a second material layer 506 may be formed over the semiconductor structure 500 using known deposition techniques, such as chemical vapor deposition and plasma enhanced chemical vapor deposition, which are well known to persons skilled in the art. The second material layer 506 may comprise a known gate electrode material, such as doped polysilicon or, in some embodiments, a metal.

After the deposition of the second material layer 506, a second planarization process, which may be a chemical mechanical polishing process, may be performed to remove portions of the second material layer 506 and the gate insulation layer 505 outside the opening in the first material layer. Residues of the second material layer 506 in the opening form a gate electrode which is separated from the substrate 201 by the gate insulation layer 505.

In some embodiments, the first material layer 551 may be removed by means of an etching process adapted to selectively remove the material of the first dielectric layer 551, leaving the materials of the substrate 201 and the second material layer 506 substantially intact. In other embodiments, the first material layer 551 may remain on the surface of the substrate 551 to form an interlayer dielectric. In such embodiments, the first material layer 551 may comprise an intrinsic elastic strain. As persons skilled in the art know, providing a strained material layer over the source region 212, the drain region 213, the extended source region 209 and the extended drain region 210 may help improve the mobility of electrons and/or holes in a channel region between the extended source region 209 and the extended drain region 210. In such embodiments, the intrinsic stress of the first material layer 551 may be controlled by adapting parameters of the process employed in the formation of the first material layer 551. Parameters for chemical vapor deposition and/or plasma enhanced chemical vapor deposition allowing the deposition of elastically strained material layers are known to persons skilled in the art and/or may be determined by means of routine experimentation.

In some embodiments, the semiconductor structure 500 may comprise further stress-creating elements in addition to or alternatively to the elastically stressed first material layer 551. For example, an embedded silicon germanide layer, which is known to persons skilled in the art, may be provided below and/or in the active region 202.

The subject matter disclosed herein is not restricted to embodiments wherein the length of the feature formed over the substrate is reduced only once between a first and a second ion implantation process. In other embodiments, three or more ion implantation processes may be performed, wherein the length of the feature is reduced between each pair of successive ion implantation processes. Thus, a series of ion implantations which start at a distance from the final feature, which is obtained after the last reduction of the length of the features, and getting closer and closer to the final feature. Thus, sophisticated dopant profiles may be created in the substrate below the feature.

Advantageously, in methods according to the subject matter disclosed herein, an etch process adapted for removing sidewall spacers may be avoided. Hence, the effort and risk of spacer removal processes may be avoided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
    providing a semiconductor substrate;
    forming a feature over said substrate, said feature comprising a gate electrode and being substantially homogeneous in a lateral direction;
    performing a first ion implantation process adapted to introduce first dopant ions into at least one portion of said substrate adjacent said feature without forming a mask layer above said substrate;
    reducing a length of said feature in said lateral direction and a height of said feature is a height direction, said height direction being substantially perpendicular to said lateral direction; and
    after said reduction of said length of said feature, performing a second ion implantation process adapted to introduce second dopant ions into at least one portion of said substrate adjacent said feature.

2. The method of claim 1, wherein said feature comprises a top surface and a side surface, and wherein said reduction of said length of said feature comprises performing an etching process wherein at least one of said side surface and said top surface is exposed to an etchant adapted to remove a material of said feature.

3. The method of claim 2, wherein both said side surface and said top surface are exposed to said etchant to reduce a height of said feature in a height direction substantially perpendicular to said lateral direction.

4. The method of claim 1, wherein an implantation depth of said second dopant ions is smaller than an implantation depth of said first dopant ions.

5. A method of forming a field effect transistor, comprising:
    providing a semiconductor substrate;
    forming a gate electrode over said substrate, a length of said gate electrode being greater than a desired gate length;
    performing a first ion implantation process adapted to introduce first dopant ions into said substrate adjacent said gate electrode to form a source region and a drain region without forming a mask layer above said substrate;
    performing a reduction of said length of said gate electrode to a length being approximately equal to said desired gate length; and
    after said reduction of said length of said gate electrode, performing a second ion implantation process adapted to introduce second dopant ions into said substrate adjacent said gate electrode to form an extended source region and an extended drain region.

6. The method of claim 5, wherein said reduction of said length of said gate electrode comprises performing an etching process.

7. The method of claim 5, wherein said reduction of said length of said gate electrode comprises a reduction of a height of said gate electrode.

8. The method of claim 5, further comprising:
    forming a gate insulation layer over said substrate before forming said gate electrode; and
    after said reduction of said length of said gate electrode, removing portions of said gate insulation layer which are not covered by said gate electrode.

9. The method of claim 8, wherein said gate insulation layer remains over said substrate during said reduction of said length of said gate electrode.

10. A method of forming a semiconductor structure, comprising:
- forming a feature above a semiconductor substrate, said feature being substantially homogeneous in a lateral direction;
- performing a first ion implantation process adapted to introduce first dopant ions into at least one portion of said substrate adjacent said feature;
- reducing a length of said feature in said lateral direction and a height of said feature in a height direction, wherein said height direction is substantially perpendicular to said lateral direction; and
- after reducing said length of said feature and said height of said feature, performing a second ion implantation process adapted to introduce second dopant ions into at least one portion of said substrate adjacent said feature.

11. The method of claim 10, wherein reducing said length of said feature in said lateral direction and reducing said height of said feature in said height direction comprises performing an etching process.

12. The method of claim 11, wherein said etching process is one of an isotropic etching process and an anisotropic etching process having a low degree of anisotropy.

13. A method of forming a semiconductor structure, comprising:
- forming a feature comprising a top surface and a side surface above a semiconductor substrate, said feature being substantially homogeneous in a lateral direction;
- performing a first ion implantation process adapted to introduce first dopant ions into at least one portion of said substrate adjacent said feature;
- performing an etching process adapted to reduce a length of said feature in said lateral direction and to reduce a height of said feature in a height direction substantially perpendicular to said lateral direction, wherein performing said etching process comprises exposing each of said side surface and said top surface to an etchant adapted to remove a material of said feature; and
- after performing said etching process, performing a second ion implantation process adapted to introduce second dopant ions into at least one portion of said substrate adjacent said feature.

14. A method of forming a field effect transistor, comprising:
- forming a gate electrode above a semiconductor substrate, an initial length of said gate electrode being greater than a desired gate length and an initial height of said gate electrode being greater than a desired gate height;
- performing a first ion implantation process adapted to introduce first dopant ions into said substrate adjacent said gate electrode to form a source region and a drain region;
- reducing said initial length and said initial height of said gate electrode to a length being approximately equal to said desired gate length and a height being approximately equal to said desired gate height while reducing said length, respectively; and
- after reducing said initial length and said initial height of said gate electrode, performing a second ion implantation process adapted to introduce second dopant ions into said substrate adjacent said gate electrode to form an extended source region and an extended drain region.

15. The method of claim 14, wherein reducing said length and said height of said gate electrode comprises performing an etching process.

* * * * *